(12) United States Patent
Alie et al.

(10) Patent No.: US 6,878,626 B1
(45) Date of Patent: Apr. 12, 2005

(54) TIW PLATINUM INTERCONNECT AND METHOD OF MAKING THE SAME

(75) Inventors: Susan A. Alie, Stoneham, MA (US); Bruce K. Wachtmann, Concord, MA (US); David S. Kneedler, Middleton, MA (US); Scott Limb, Cambridge, MA (US); Kieran Nunan, Carlisle, MA (US)

(73) Assignee: Analog Devices, Inc., Norwood, MA (US)

(*) Notice: Subject to any disclaimer, the term of this patent is extended or adjusted under 35 U.S.C. 154(b) by 197 days.

(21) Appl. No.: 10/325,091

(22) Filed: Dec. 20, 2002

Related U.S. Application Data

(62) Division of application No. 10/044,009, filed on Jan. 11, 2002.

(51) Int. Cl.$^7$ .......................................... H01L 21/44
(52) U.S. Cl. ................................. 438/683; 438/686
(58) Field of Search ..................... 438/683, 3, 637, 438/647, 648, 649, 651, 655, 656, 664, 682, 684, 686, 689, 754, 755

(56) References Cited

U.S. PATENT DOCUMENTS

| | | | | |
|---|---|---|---|---|
| 5,046,043 A | * | 9/1991 | Miller et al. ............... | 365/145 |
| 5,099,305 A | * | 3/1992 | Takenaka .................... | 257/295 |
| 5,229,309 A | * | 7/1993 | Kato ............................ | 438/3 |
| 5,561,307 A | * | 10/1996 | Mihara et al. .............. | 257/295 |
| 5,638,946 A | * | 6/1997 | Zavracky ..................... | 200/181 |

OTHER PUBLICATIONS

"Development of Flexible Stimulation Devices For A Retina Implant System," Stieglitz et al. 19$^{th}$ *International Conference–IEEE/EMBS* Oct. 30–Nov. 2, 1997, Chicago, IL.

"Chemical Vapor Deposition (CVD) of Iridium and Platinum Films and Gas–Phase Chemical Etching of Iridium Thin Films," Xu et al. *Mat. Res. Soc.Symp.* Proc. vol. 541, 1999.

\* cited by examiner

*Primary Examiner*—David Nhu
(74) *Attorney, Agent, or Firm*—Gauthier & Connors LLP

(57) ABSTRACT

A metallization stack is provided for use as a contact structure in an integrated MEMS device. The metallization stack includes a titanium-tungsten adhesion and barrier layer formed with a platinum layer formed on top. The platinum feature is formed by sputter etching the platinum in argon, followed by a wet etch in aqua regia using an oxide hardmask. Alternatively, the titanium-tungsten and platinum layers are deposited sequentially and patterned by a single plasma etch process with a photoresist mask.

10 Claims, 9 Drawing Sheets

US 6,878,626 B1

TIW PLATINUM INTERCONNECT AND METHOD OF MAKING THE SAME

CROSS-REFERENCE TO RELATED APPLICATIONS

This application is a divisional of co-pending U.S. patent application Ser. No. 10/044,009, filed on Jan. 11, 2002. The entire contents of U.S. patent application Ser. No. 10/044, 009 and hereby incorporated by reference.

BACKGROUND OF THE INVENTION

The invention relates to the field of interconnects or electrodes for integrated MEMS devices.

Integrated microelectromechanical systems (MEMS) devices are monolithic (single-chip) MEMS devices that contain electrodes with sensing, control or processing circuitry. The production of integrated MEMS devices is based, in large part, upon well-developed techniques in the disciplines of integrated circuit semiconductor manufacturing and photolithography. As such, these devices use metal interconnects/electrodes similar to those for traditional integrated devices. Optical MEMS (such as a micro-mirror for fiber-optic switching), however, require metal interconnects that provide a noble metal surface in the bond pads for epoxy bond. In addition, stress requirements for optical MEMS preclude the use of passivation films over the interconnects. Therefore, the metal of the interconnect must be inert. Similarly, Bio-MEMS devices (such as a DNA analysis chip) require electrodes that are corrosion resistant in the context of exposure to biological substances. These requirements are not met by traditional interconnects/electrodes, such as copper or aluminum interconnects/electrodes produced in standard integrated circuit (IC) processing facilities.

Therefore, the present invention provides a metallization stack utilizing platinum as a noble metal for use in integrated MEMS devices, particularly optical MEMS and Bio-MEMS devices. The present invention also provides a method of patterning platinum.

SUMMARY OF THE INVENTION

In one aspect of the present invention, a metallization stack is provided for use as a contact structure in an integrated MEMS device. The metallization stack comprises a titanium-tungsten layer that operatively contacts an electrically conductive structure in the integrated MEMS device, and a platinum layer formed over the titanium-tungsten layer. In another aspect of the present invention, a method of forming a metallization stack for use as a contact structure in an integrated MEMS device is provided. The method comprises forming a titanium-tungsten layer that operatively contacts an electrically conductive structure in the integrated MEMS device, and forming a platinum layer over the titanium-tungsten layer.

In another aspect of the present invention, an integrated MEMS device comprising a metallization stack having a contact layer of platinum and an adhesion layer of TiW is provided.

In another aspect of the present invention, a method is provided for patterning platinum for fabricating a semiconductor device. Platinum is deposited on a semiconductor substrate. An oxide hardmask is deposited on the platinum. The oxide hardmask is patterned and etched to leave oxide in the areas patterned platinum is to be formed. The exposed platinum is then etched using a combination dry and wet etch, and after the platinum is etched the hardmask is removed.

DETAILED DESCRIPTION OF THE INVENTION

Figure 1:
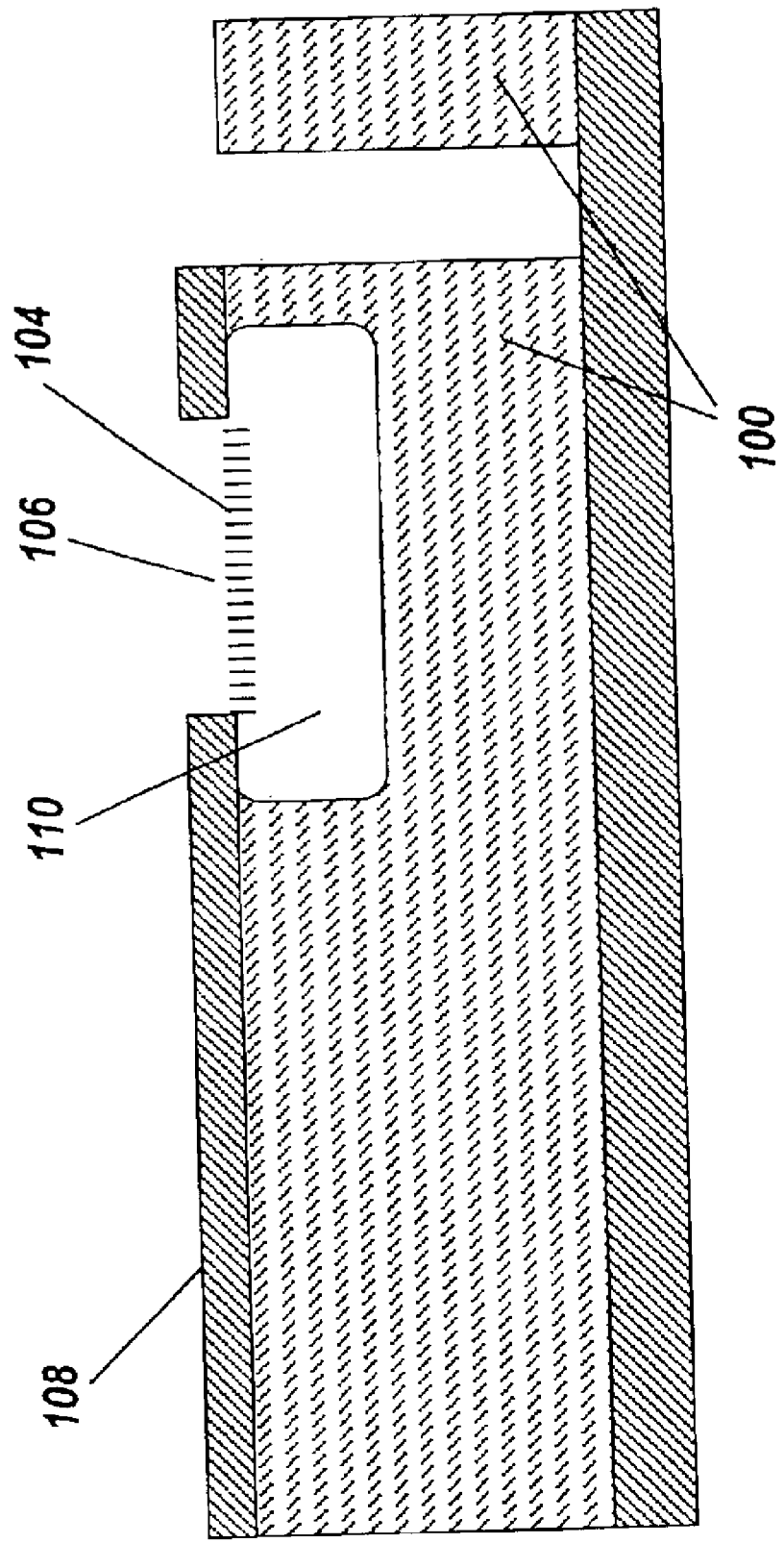
FIG. 1 illustrates a platinum (Pt) metallization stack used to contact active silicon elements that are part of an integrated MEMS device.

A Pt metallization stack is used in integrated MEMS devices so as to provide benefits over prior integrated MEMS interconnect/electrode structures. In one embodiment, the Pt metallization stack is used as an interconnect to contact active silicon elements that are part of an integrated MEMS device. In this case, the Pt is used because stress or bonding requirements require an unpassivated metal or a noble metal for packaging. In another embodiment, the Pt metallization stack is used as an electrode that is monolithically integrated into a standard silicon semiconductor circuit of the integrated MEMS device. The Pt metallization stack is used in this case for MEMS applications that require a corrosive resistant electrode. In addition to the advantages provided by Pt's noble qualities, Pt is particularly advantageous because it is compatible with standard integrated circuit processing facilities. FIG. 1 illustrates a platinum (Pt) metallization stack used to contact active silicon elements that are part of an integrated MEMS device. Optical MEMS devices requiring a noble metal for bonding are exemplary integrated MEMS devices using the Pt metallization stack in this manner. As shown, a silicon substrate 100 has an active silicon element 110 formed in it. A Pt interconnect 108 contacts the active silicon element 110 via a Titanium-tungsten (TiW) adhesion layer 106 and platinum silicide layer 104.

Figure 2:
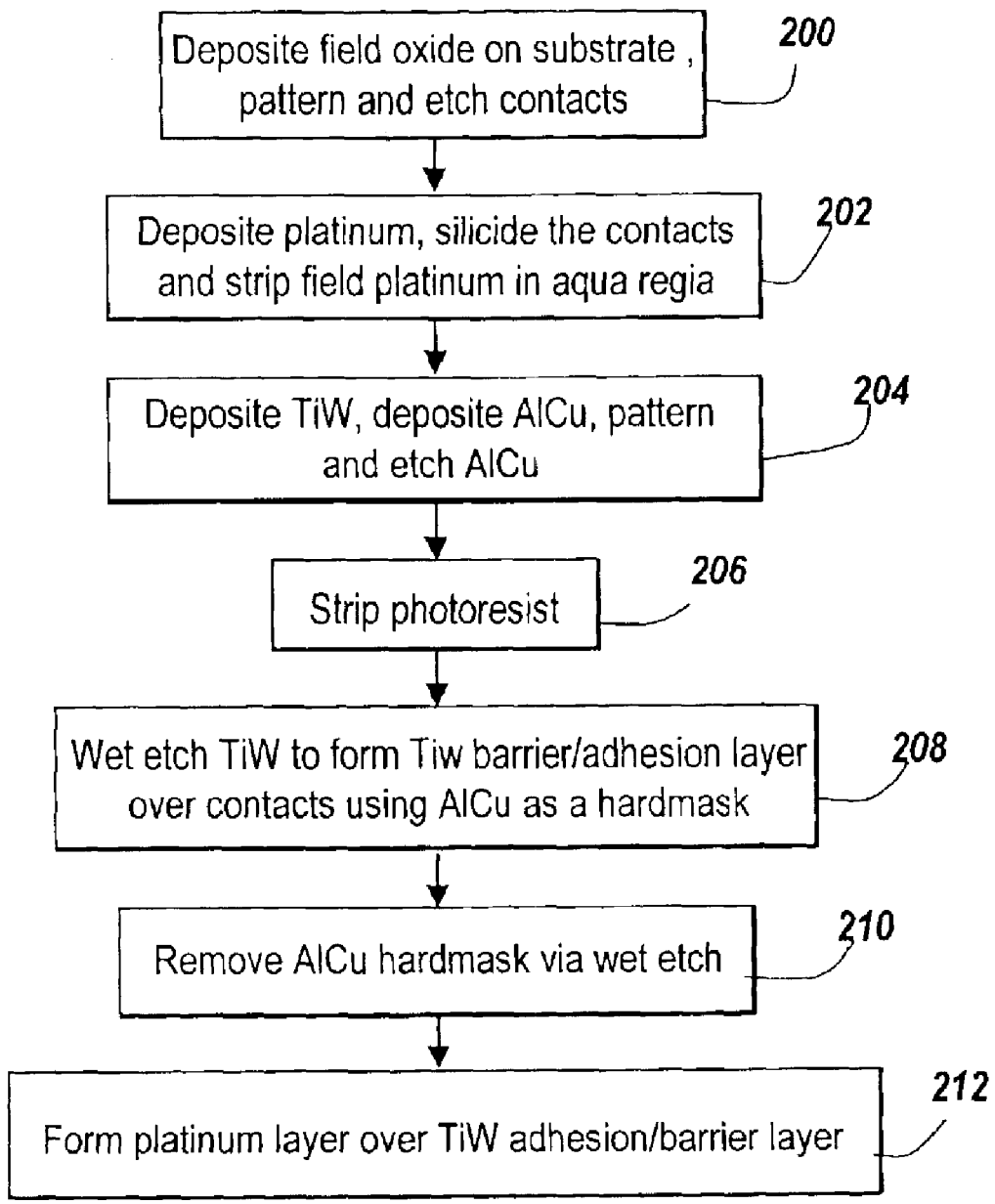
FIG. 2 illustrates a method to form a metallization stack for use as a contact structure in an integrated MEMS device.
Figure 4A:
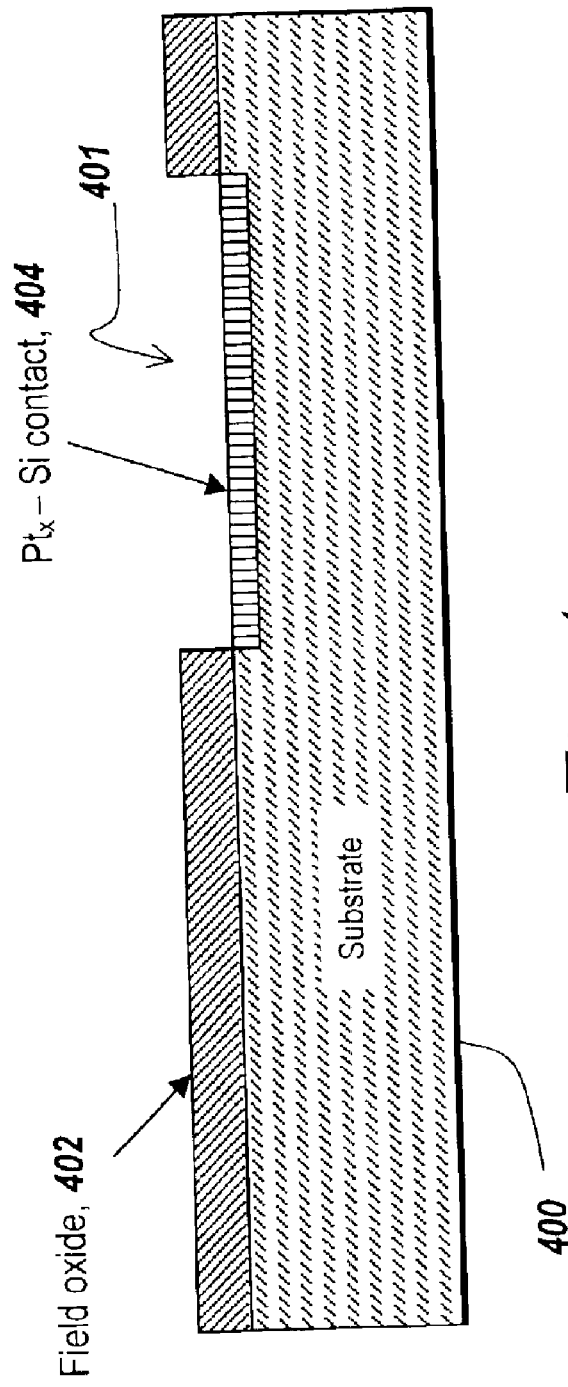
FIGS. 4a–4d illustrate the results of various steps illustrated in FIGS. 1 and 2.

FIG. 2 illustrates a method to form a Pt metallization stack to contact active silicon elements in an integrated MEMS device. A field oxide is deposited on a substrate of silicon, the field oxide is patterned and etched to form holes at the contact area, and the photoresist from this process is stripped 200. Next, a layer of platinum is deposited on the wafer, and a silicide layer is formed from the platinum on the silicon substrate at the bottom of the contact hole to create a $Pt_x$-Si contact and the field platinum is stripped in aqua regia 202. A result of these steps is illustrated in FIG. 4a. As illustrated, a silicon substrate 400 has a field oxide layer 402 on the surface of substrate 400, which has a hole 401 at the contact area. A $Pt_x$-Si contact 404 is formed in the contact area by creating a silicide layer on the silicon substrate at the contact area.

Figure 4B:
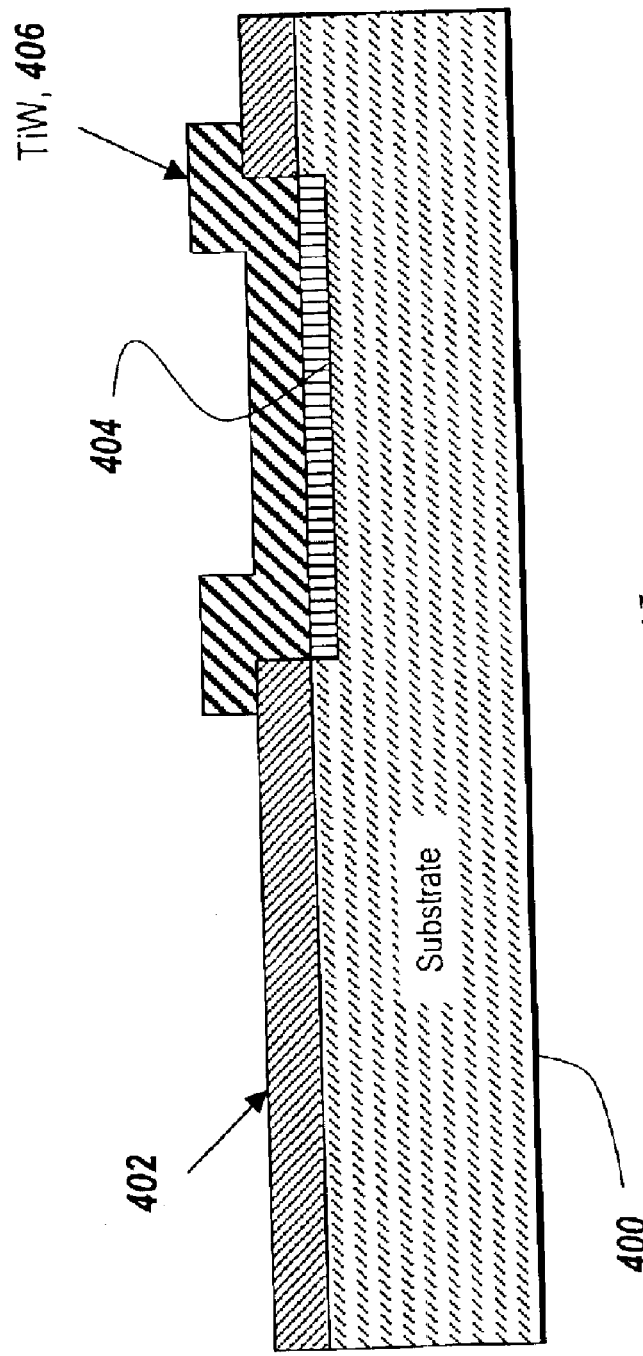

TiW, preferably in the proportion of 10% titanium-90% tungsten, is utilized as an adhesion layer and a barrier layer. This TiW is next deposited on the wafer. A layer of AlCu is deposited on the TiW layer as a hardmask, patterned and etched 204, such that a layer of TiW will be left over the $Pt_x$-Si contact. The photoresist from the etching of the AlCu is then removed 206. Wet etching is performed on the TiW layer to form the TiW adhesion/barrier layer over the Pt$_x$-Si contacts utilizing the AlCu hardmask 208. The AlCu hardmask is then removed via a wet etch process 210. A result of these steps is illustrated in FIG. 4*b*. As shown, a TiW layer 406 is formed over Pt$_x$-Si contact 404.

Figure 3:
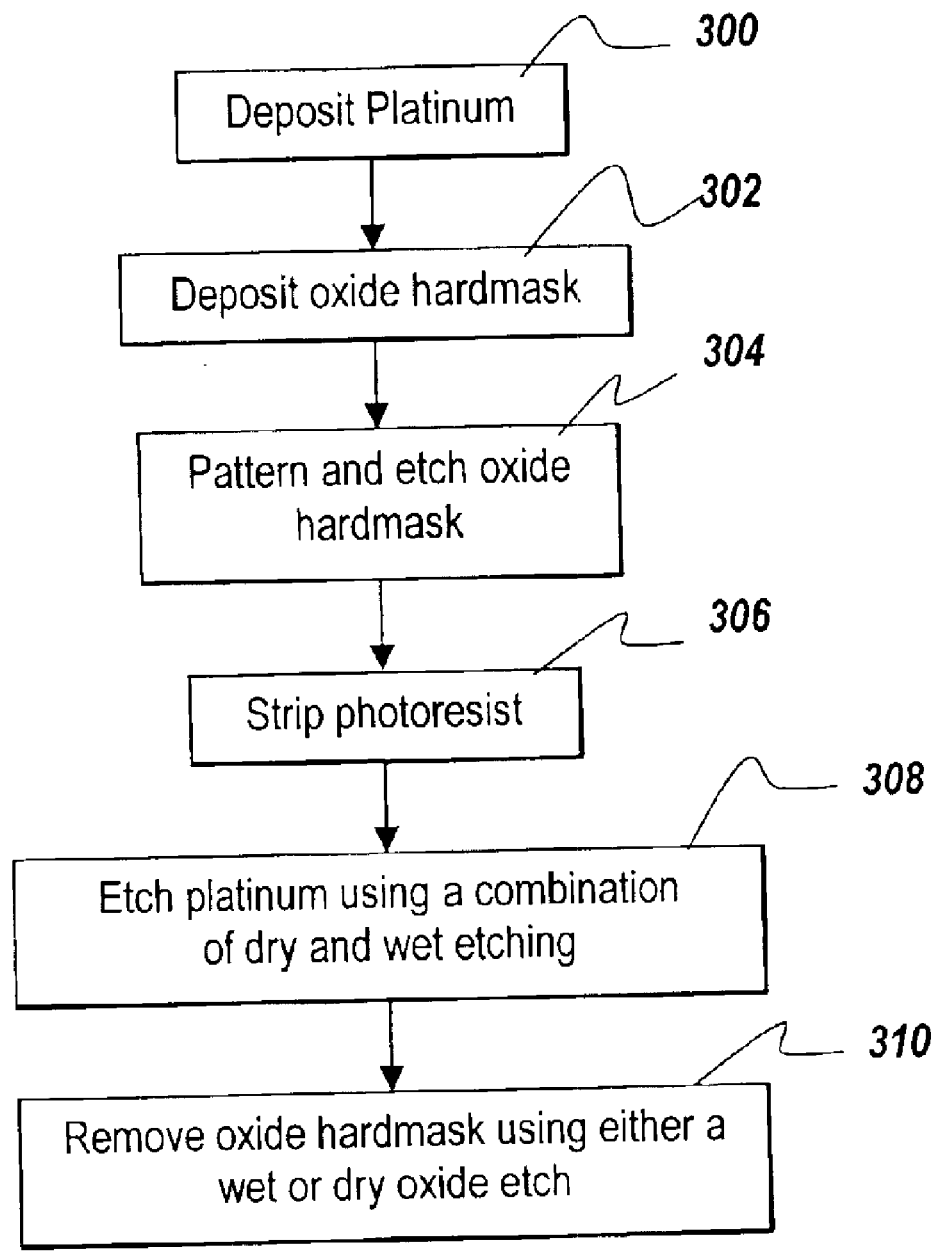
FIG. 3 illustrates a method for patterning platinum.
Figure 4C:
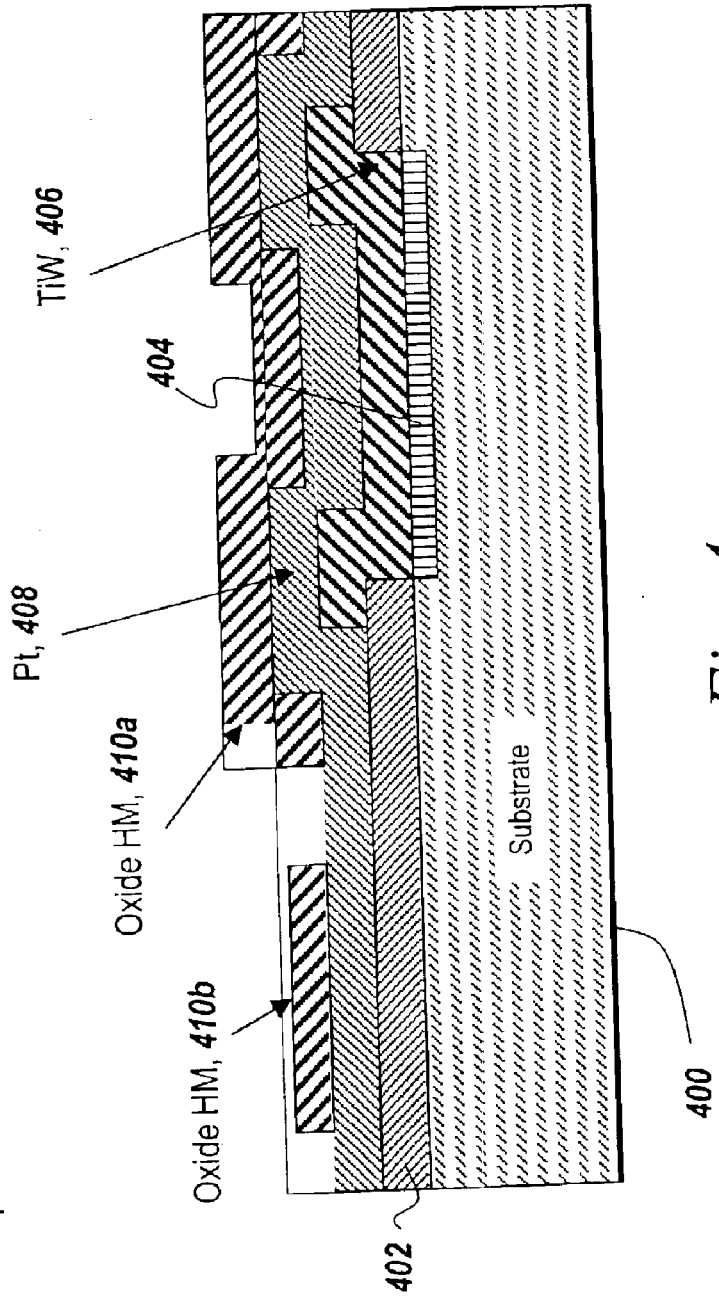

Finally, a platinum layer is formed over the TiW layer 212, preferably utilizing the method illustrated in FIG. 3. Platinum is deposited utilizing any known technique on the wafer 300. An oxide hard mask is then deposited on top of the platinum 302. The oxide hardmask is then patterned and etched utilizing standard photolithography and etch techniques 304. In such techniques, a photoresist is applied to the hardmask and formed into the desired pattern, exposing portions of the hardmask. The entire structure is then exposed to an etchant, which etches away the exposed portions of the hardmask. After the exposed portions have been etched, the photoresist is removed 306. As shown in FIG. 4*c*, these steps result in deposited platinum 408 covering field oxide 402 and TiW layer 406 along with a patterned oxide hardmask layer. An area of the oxide hardmask 410*a* covers the area on which the platinum is to be retained to form a platinum layer over TiW layer 406. It should be noted that, preferably, oxide hardmask area 410*a* is oversized from TiW layer 406 to prevent exposure of TiW layer 406 to a subsequent wet etch in aqua regia.

The platinum is then etched using a combination of dry and wet etching 308 to remove the exposed areas of deposited platinum 408. Once the platinum has been etched, the oxide hardmask is removed using either a dry or wet oxide etch 310.

For the etching of deposited platinum 408, first the dry etching is performed by sputter etching in, preferably, Argon. As is well known in the art, sputter etching utilizes ionized particles of a charged gas plasma to bombard the surface of a substrate, in this case the platinum, to etch away or "sputter" substrate particles from the surface of the substrate. In sputter etching, a plasma gas, in the present case preferably argon, is typically introduced into the processing space of a processing chamber. The substrate to be etched is electrically charged or biased. Energy is coupled to the gas, which ionizes the gas particles so that they acquire a net charge that is of opposite polarity to the charge of the substrate. The ionized particles of the gas collectively form a gas plasma or plasma cloud. The charge of the ionized particles of the plasma is opposite that of the substrate, and therefore, the ionized particles in the plasma are attracted to the substrate surface. As a result of this attraction, the ionized particles bombard the surface and dislodge material particles to etch the substrate. Once this is completed, the etching of the platinum is continued by a wet etch of the platinum in aqua regia. As is well known, wet etching comprises immersing the structure in a liquid bath of a chemical etchant, which is preferably aqua regia.

Figure 4D:
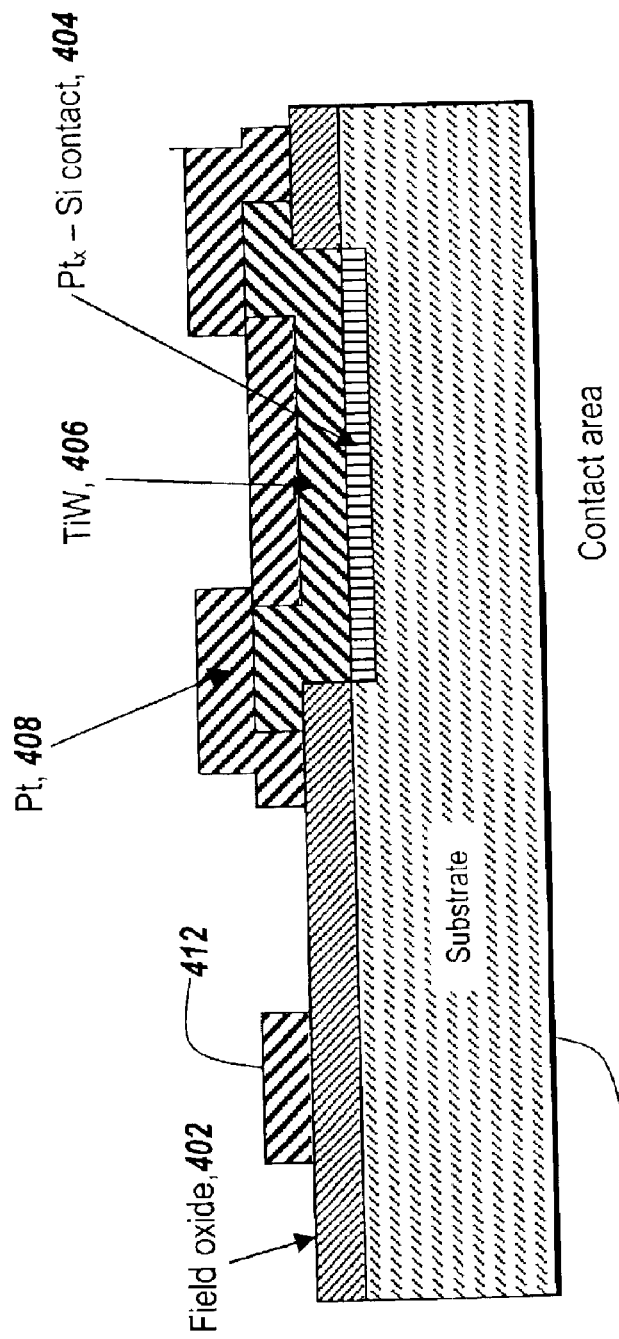

The final contact structure from these steps is illustrated in FIG. 4*d*. A platinum layer 408 is formed, under which is TiW adhesion/barrier 406 layer formed over Pt$_x$-Si contact area 404.

When platinum layer 408 is a portion of platinum wiring (interconnect) formed on field oxide layer 402, or when platinum wiring is formed on field oxide layer 402 in addition to the contact structure, the platinum patterning method is preferably utilized to form both platinum layer 408 and the platinum wiring simultaneously. This is additionally illustrated in FIGS. 4*c* and 4*d*. As shown in FIG. 4*c*, in addition to oxide hardmask area 410*a*, an oxide hardmask area 410*b* covers deposited platinum 408 in an area where platinum wiring is to be formed. After the etching of the deposited platinum 408 and removal of the patterned oxide hardmask, platinum-wiring 412 is left on field oxide layer 402, as shown in FIG. 4*d*.

Figure 5:
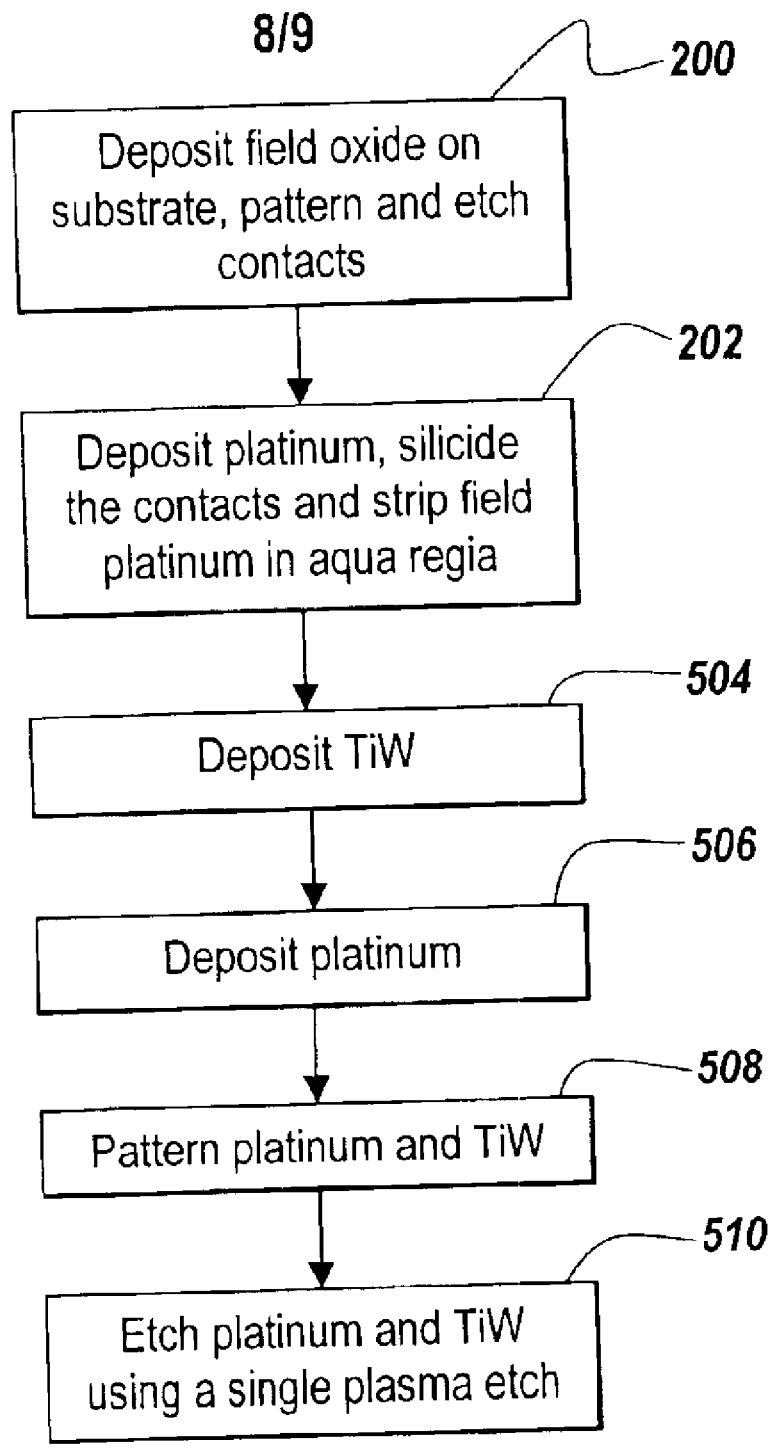
FIG. 5 illustrates an alternate method to form a metallization stack for use as a contact structure in an integrated MEMS device.

FIG. 5 illustrates an alternate method to form the Pt metallization stack to contact active silicon elements in an integrated MEMS device. In this alternative, TiW layer 406 and Pt layer 408 are deposited sequentially and patterned simultaneously by plasma etch, using a photoresist as a mask. As shown, the process is the same as that of FIG. 1 up to step 102. After step 102, TiW is deposited on the surface of the substrate 504. Platinum is next deposited on top of the TiW 506. The platinum and TiW are then patterned using a photoresist mask 508 and simultaneously etched using a single plasma etch 510.

Figure 6:
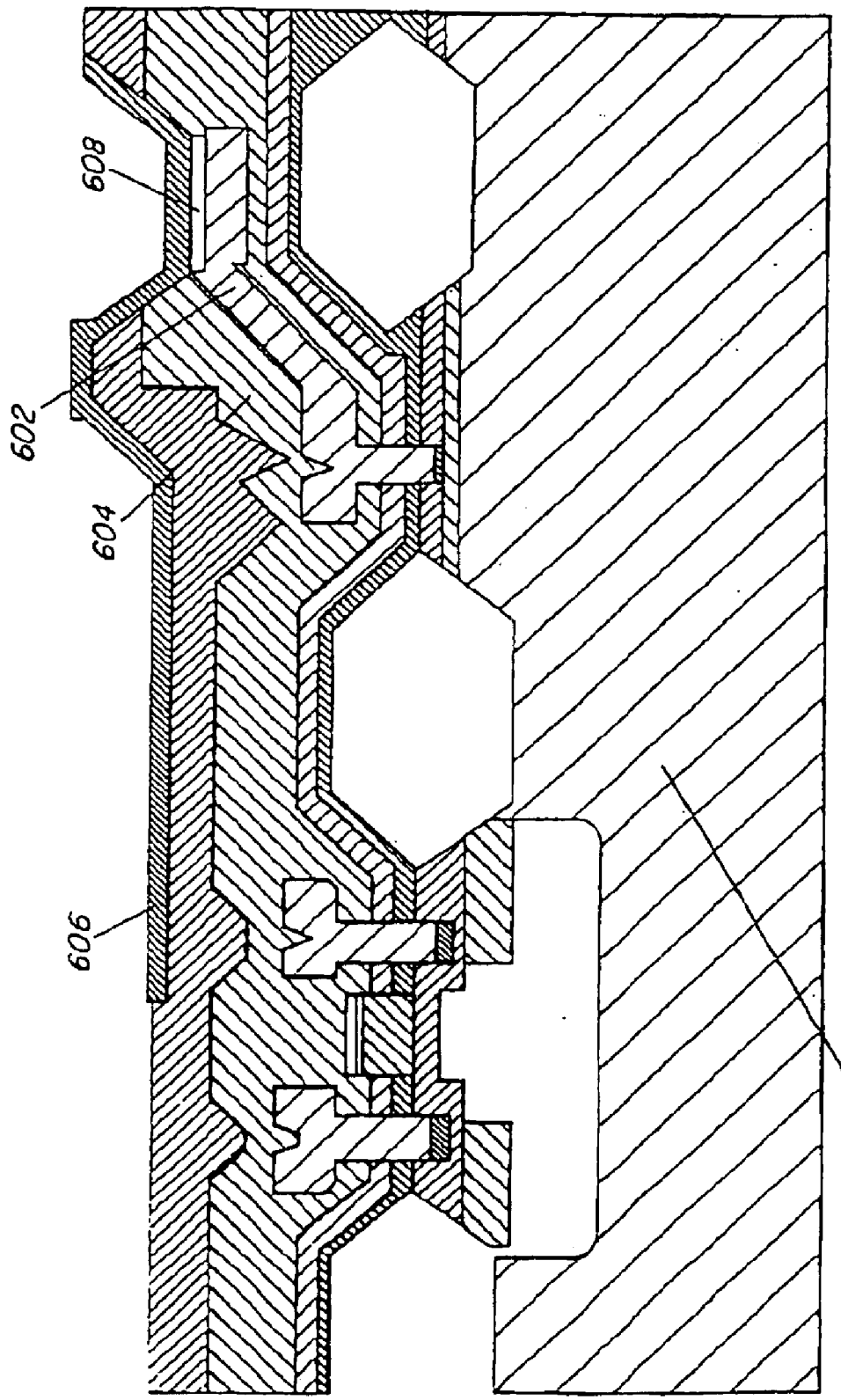
FIG. 6 illustrates the Pt metallization stack used as a MEMS electrode that has been monolithically integrated into a standard silicon semiconductor circuit.

FIG. 6 illustrates the Pt metallization stack used as a MEMS electrode that has been monolithically integrated into a standard silicon semiconductor circuit. Bio-MEMS devices used to handle corrosive or harsh fluids are exemplary integrated MEMS devices using the Pt metallization stack in this manner. As shown, an active silicon device 600 has conventional integrated circuit interconnections 602 with a passivation layer 604. Pt electrode 606 contacts conventional interconnect 602 via TiW adhesion layer 608. When used in this application, the metallization stack is formed by either the method described in FIG. 2 or 5, absent steps 202 and 204 because the platinum silicide is not used to contact conventional interconnect 602.

Although the present invention has been shown and described with respect to several preferred embodiments thereof, various changes, omissions and additions to the form and detail thereof, may be made therein, without departing from the spirit and scope of the invention. For example, the platinum patterning technique is not limited to use with the metallization scheme described herein, but rather is appropriate for the formation of any patterned platinum features required for the fabrication of a semiconductor device. In addition, while the metallization scheme of the present invention is particularly advantageous for optical MEMS devices and Bio-MEMS devices, it should not be construed as limited thereto, but rather it is appropriate for integrated MEMS devices in which a noble metal is advantageous for interconnects/electrodes.

What is claimed is:

1. A method of forming a metallization stack for use as a contact structure in an integrated MEMS device, the method comprising:

providing a substrate having an electrically conductive structure therein;

forming a field oxide formed over the substrate;

forming having a contact hole in the field oxide;

forming a silicide layer formed in the contact hole of said field oxide;

forming, on the silicide layer, a titanium-tungsten layer that operatively contacts the electrically conductive structure in the integrated MEMS device, and forming a platinum layer, a first portion of the platinum layer being formed directly on the titanium-tungsten layer, a second portion being formed directly on said field oxide.

2. The method of claim 1 wherein the silicide layer is a platinum silicide layer and the electrically conductive structure is an active silicon element formed in the integrated MEMS device and the titanium-tungsten layer contacts the active silicon element via the platinum silicide.

3. The method of claim 2 wherein the forming a titanium-tungsten layer step further comprises:

depositing titanium-tungsten on the substrate including the platinum silicide;

depositing a hardmask material over the titanium-tungsten;

removing the hardmask material except for a portion of the hardmask material above the platinum silicide;

removing the titanium-tungsten except for a portion of the titanium-tungsten under the hardmask material above the platinum silicide, and removing the hardmask material above the platinum silicide.

4. The method of claim 3, wherein the hardmask material is AlCu.

5. The method of claim 1, wherein the forming a platinum layer step further comprises:

depositing platinum on the substrate including the titanium-tungsten layer;

depositing an oxide hardmask over the platinum;

removing the oxide hardmask except for a portion of the oxide hardmask above the titanium tungsten layer;

removing the platinum except for a portion of the platinum under the oxide hardmask above the titanium-tungsten via a combination of dry etching and wet etching, and removing the portion of the oxide hardmask above the titanium-tungsten layer.

6. The method of claim 5, wherein platinum is removed in the removing the platinum step by sputter etching the platinum in argon followed by wet etching in aqua regia.

7. The method of claim 1, wherein the steps further comprise:

depositing a hardmask material over the titanium-tungsten;

removing the hardmask material except for a portion of the hardmask material above the silicide;

removing the titanium-tungsten except for a portion of the titanium-tungsten under the hardmask material above the silicide;

removing the hardmask material above the silicide;

depositing platinum on the semiconductor substrate including the titanium-tungsten layer;

depositing an oxide hardmask over the platinum;

removing the oxide hardmask except for a portion of the oxide hardmask above the titanium tungsten layer;

removing the platinum except for a portion of the platinum under the oxide hardmask above the titanium-tungsten via a combination of dry etching and wet etching, and removing the portion of the oxide hardmask above the titanium-tungsten layer.

8. The method of claim 1 wherein the platinum layer and titanium-tungsten layer are formed by a single plasma etch.

9. The method of claim 1 wherein the integrated MEMS device is an optical MEMS.

10. The method of claim 1 wherein the integrated MEMS device is a Bio-MEMS device.

* * * * *